(12) United States Patent  (10) Patent No.: US 6,486,558 B2
Sugiyama et al.  (45) Date of Patent: Nov. 26, 2002

(54) SEMICONDUCTOR DEVICE HAVING A DUMMY PATTERN

(75) Inventors: Masao Sugiyama, Tokyo (JP); Kenji Yoshiyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/767,134

(22) Filed: Jan. 23, 2001

(65) Prior Publication Data

US 2002/0040986 A1 Apr. 11, 2002

(30) Foreign Application Priority Data

Oct. 10, 2000 (JP) ........................................ 2000-309140

(51) Int. Cl.$^7$ .............................................. H01L 23/48
(52) U.S. Cl. ...................................... 257/758; 257/211
(58) Field of Search ................................. 257/211, 148, 257/219, 330, 758, 750, 752, 736; 438/17, 118, 128, 129, 622, 652; 365/51, 52, 210, 390

(56) References Cited

U.S. PATENT DOCUMENTS 5,416,350 A * 5/1995 Watanabe ................... 257/330
5,923,947 A * 7/1999 Sur .............................. 438/17
6,327,166 B1 * 12/2001 Itoh et al. ...................... 365/51

FOREIGN PATENT DOCUMENTS

| JP | 2-177558 | 7/1990 |
| JP | 4-93071 | 3/1992 |
| JP | 5-190791 | 7/1993 |
| JP | 6-5803 | 1/1994 |
| JP | 6-188393 | 7/1994 |
| JP | 8-279600 | 10/1996 |
| JP | 10-229178 | 8/1999 |
| JP | 11-340431 | 12/1999 |

* cited by examiner

Primary Examiner—David Nelms
Assistant Examiner—Long K. Tran
(74) Attorney, Agent, or Firm—McDermott, Will & Emery

(57) ABSTRACT

A semiconductor device having a memory cell region comprising a plurality of memory cells is described, and a stable characteristic is imparted to all the memory cells provided in the memory cell block. Impurities are implanted into a memory cell region of a silicon substrate at predetermined intervals, thus forming a plurality of wells. A resist film used as a mask for implanting impurities has strip-shaped patterns and a broad pattern. Since the strip-shaped patterns located close to the broad pattern are inclined, the characteristics of the wells located in the vicinity of the outer periphery of the memory cell region become unstable. The wells having unstable characteristics are taken as dummy wells which do not affect the function of a semiconductor device.

6 Claims, 5 Drawing Sheets

SEMICONDUCTOR DEVICE HAVING A DUMMY PATTERN

BACKGROUND OF THE INVENTION

1. Field of the Invention

The present invention relates to a semiconductor device having a dummy pattern, and more particularly, to a semiconductor device having a memory cell block including a plurality of memory cells.

2. Description of the Background Art

A semiconductor device, such as a memory device, has a memory cell block comprising a plurality of memory cells. A plurality of memory cells included in a memory cellblock are formed by means of repetition of an identical pattern. As the area of the memory cell block becomes wider, the environment of memory cells located at the center of the memory cell block becomes apt to greatly differs from the environment of memory cells located in the vicinity of the periphery of the memory cell block. An example of such a difference in environment of memory cells will be described by reference to FIGS. 8A through 8D.

FIGS. 8A through 8D are enlarged cross-sectional views showing the outermost periphery portion of a memory cell block formed on a conventional semiconductor device.

As shown in FIG. 8A, according to a conventional method of manufacturing a semiconductor device, a thermal oxide film 12 having a thickness of about 15 nm, a polysilicon film 14 having a thickness of about 50 nm, and a nitride film 16 having a thickness of about 165 nm are deposited, in this sequence, on a silicon substrate 10. These films are patterned by means of photolithography and etching. Trenches 18 having a depth of about 300 nm are formed in the silicon substrate 10 by means of etching while the thus-patterned nitride film 16 and the like are taken as a mask.

An oxide layer is formed to a thickness of about 50 nm on the interior walls of the respective trenches 18 by means of thermal oxidation of the silicon substrate 10. As shown in FIG. 8B, in order to fill each of the trenches 18 with an oxide film, an oxide film 20 is deposited to a thickness of about 500 nm over the entire surface of the silicon substrate 10. Because of its characteristics, the oxide film 20 is deposited thickly on a narrow pattern and thinly on a wide pattern. For this reason, the thickness of the oxide film 20 becomes thinner toward the periphery of the memory cell block relative to the thickness in the center thereof.

As shown in FIG. 8C, according to the conventional method, the entire surface of the silicon substrate 10 is abraded by means of chemical-and-mechanical polishing (CMP). As illustrated, irregularities arising in the thickness of the oxide film 20 before CMP operation are not absorbed by CMP operation, and the irregularities still remain after the CMP process.

As shown in FIG. 8D, the nitride film 16, the polysilicon film 14, and the thermal oxide film 12 remaining on the surface of the silicon substrate 10 are removed after the CMP operation. As a result, an isolation oxide film 22 for separating individual active regions from each other is formed on the surface of the silicon substrate 10. Irregularities in the thickness of the oxide film 20 which have remained after the CMP operation still remain as irregularities in the thickness of the isolation oxide film 22. As a result, the isolation oxide film 22 surrounding the outermost periphery portion of a memory cell block becomes thinner than the isolation oxide film 22 located in the vicinity of the center of the memory cell block.

After formation of the isolation oxide film 22, a gate dielectric film is formed to a thickness of 30 to 100 angstroms on the surface of the silicon substrate 10. Subsequently, a gate electrode made of polysilicon is patterned onto the gate dielectric film. Further, a side wall dielectric film is formed from TEOS or a nitride film so as to cover the side wall of a gate electrode.

According to the conventional method for manufacturing a semiconductor device, the isolation oxide film 22 is also removed during an etching process for forming a gate electrode or a side wall dielectric film on the silicon substrate 10. As mentioned above, the thickness of the isolation oxide film 22 surrounding the outermost periphery portion of the memory cell block tends to becomes smaller than the thickness of the isolation oxide film 22 located in the vicinity of the center of the memory cell block. Because of such a tendency, the isolation oxide film 22 surrounding the outermost periphery portion of the memory cell block may becomes lower than the surface of the silicon substrate 10 under the influence of the foregoing various etching operations.

In the area where the surface of the isolation oxide film 22 is lower than the surface of the silicon substrate 10, the resistance to a junction leakage is deteriorated. For this reason, in the conventional semiconductor device, the memory cells located along the outermost periphery of the memory cell block are susceptible to failures ascribable to a junction leakage. Thus, in the semiconductor device having a memory cell block, the environment of memory cells located in the vicinity of the center of the memory cell block greatly differs from the environment of memory cells located in the vicinity of the periphery of the memory cell block. Hence, anomalies are likely to arise mainly in the memory cells located in the vicinity of the outermost periphery of the memory cell block.

SUMMARY OF THE INVENTION

The present invention has been conceived to solve the foregoing drawbacks of the conventional methods and is aimed at providing a semiconductor device having a structure suitable for imparting a stable characteristic to all memory cells provided in a memory cell block.

The above objects of the present invention are achieved by a semiconductor device described below. The semiconductor device includes a plurality of impurity-diffused layers provided on a silicon substrate at predetermined intervals. One or some of the plurality of impurity-diffused layers located at the outermost periphery position are dummy diffusion layers which are functionally not required by the semiconductor device.

The above objects of the present invention are also achieved by a semiconductor device described below. The semiconductor device includes constituent elements of the same kind which are provided in a plurality of layers. The semiconductor device also includes dummy patterns such that the constituent elements are provided in substantially identical proportions in the plurality of layers. Interconnection elements are provided for fixing the electric potential of the dummy patterns to a predetermined electric potential.

The above objects of the present invention are further achieved by a semiconductor device described below. The semiconductor device includes dummy patterns formed such that constituent elements are provided in a predetermined layer so as to assume a uniform density or pitch over the entire surface of the predetermined layer. The semiconductor device also includes interconnection elements for fixing the electric potential of the dummy patterns to a predetermined electric potential.

Other objects and further features of the present invention will be apparent from the following detailed description when read in conjunction with the accompanying drawings.

DESCRIPTION OF THE PREFERRED EMBODIMENTS

Figure 1:
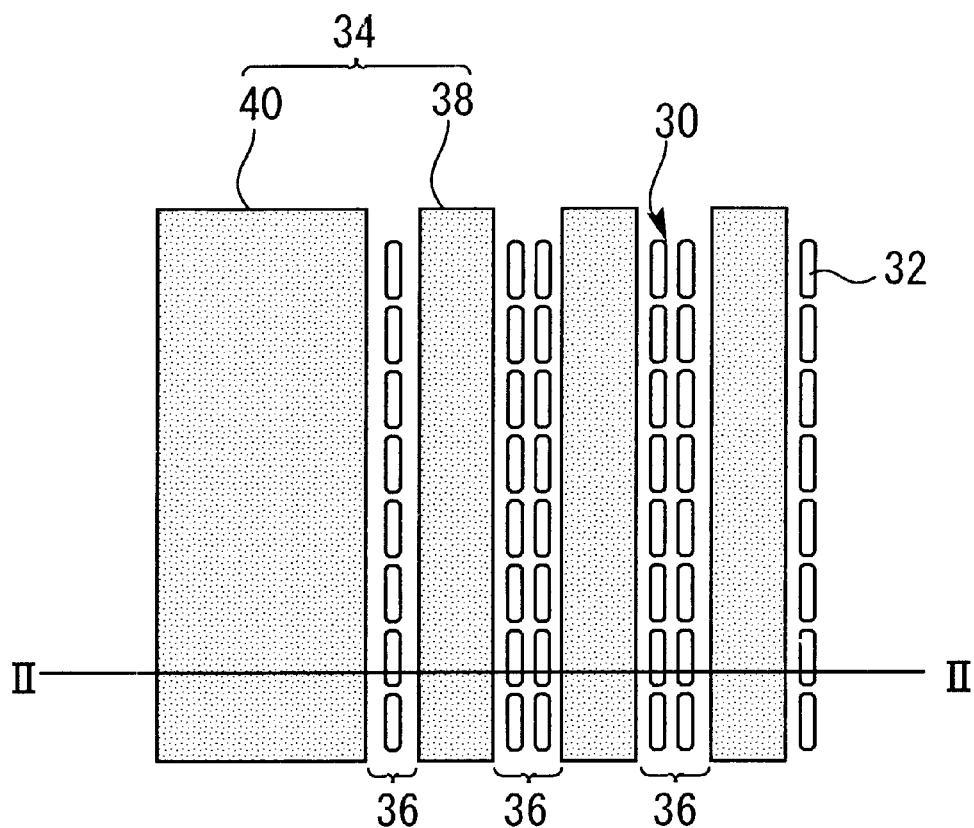
FIG. 1 is a plan view showing a resist film employed in a first embodiment of the present invention.

Preferred embodiments of the present invention will be described hereinbelow by reference to the accompanying drawings. Elements common to the accompanying drawings are assigned the same reference numerals, and repetition of their explanations is omitted.

First Embodiment

FIG. 1 is an illustration for describing a method of manufacturing a semiconductor device according to a first embodiment of the present invention. In FIG. 1, reference numeral 30 designates a silicon substrate of the semiconductor device; and 32 designates a pattern of a memory cell to be formed on the silicon substrate 30. Further, reference numeral 34 designates a resist film to be used in an ion implantation process for forming wells 36 in the silicon substrate 30 (hereinafter referred to as "well implantation").

The resist film 34 for well implantation usually has a thickness of about 2 μm. The wells 36 must be formed at appropriate intervals within an area where a plurality of memory cells are to be formed; that is, an area where a memory cell block is to be formed (hereinafter referred to as a "memory cell region"). To this end, the resist film 34 has strip-shaped patterns 38, each having a thickness of several micrometers within the memory cell region. During the well implantation operation, implantation of ions into an area of the resist film 34 which does not require formation of the wells 36 must be prevented. Therefore, a broad pattern 40 of tens of micrometers is formed adjacent to the memory cell region of the resist film 34.

Figure 2:
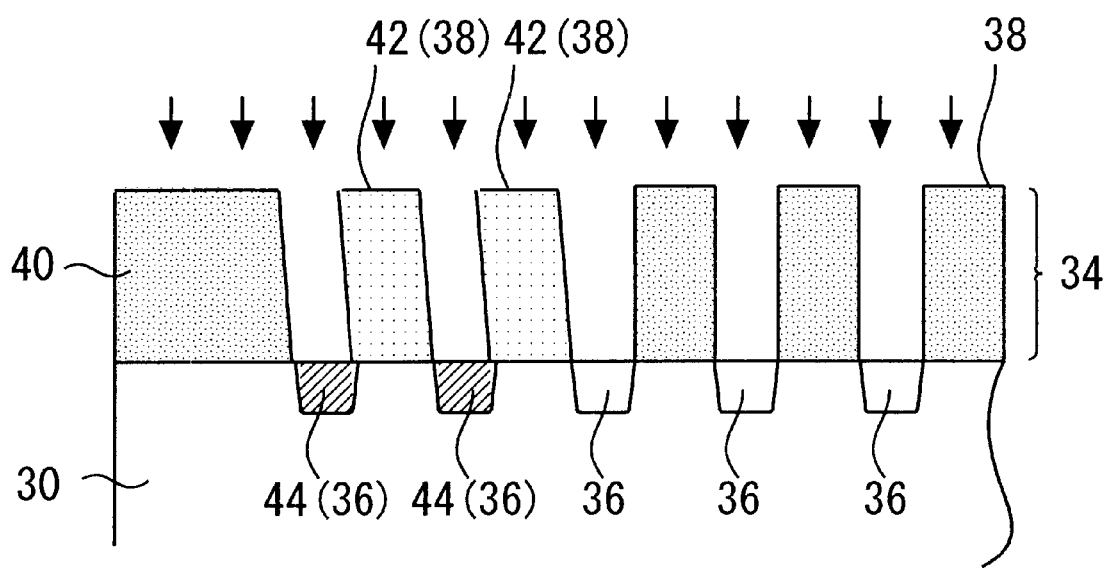
FIG. 2 is a cross-sectional view showing the resist film employed in the first embodiment of the present invention.

FIG. 2 is a cross-sectional view of the silicon substrate 30 and the resist film 34 taken along line II—II shown in FIG. 1. In a case where the resist film 34 has the strip-shaped patterns 38 and the board pattern 40, the strip-shaped patterns 38 adjacent to the broad pattern 40 are deformed during development of the resist film 38 and eventually become inclined toward the broad pattern 40, as shown in FIG. 2.

Well implantation operation is performed while the resist film 34 which has been developed is taken as a mask by means of implanting impurities into the silicon substrate 30 from above the film 34. At this time, the inclined strip-shaped patterns 38 unduly hinder implantation of impurities, wherewith the silicon substrate 30 fails to be doped with impurities at appropriate concentrations. For this reason, anomalies are likely to arise in memory cells ascribable to failures in characteristics of wells 36 in the vicinity of outermost periphery of the memory cell region.

In the present embodiment, in order to prevent occurrence of anomalies in memory cells, which would otherwise be caused by failures in the characteristics of the wells 36, one or more strip-shaped patterns 38 located in the vicinity of the outermost periphery of the memory cell region are taken as dummy patterns 42, whereby functionally-useless dummy wells 44 are formed in the vicinity of the outermost periphery of the memory cell region. FIG. 2 shows a state in which two dummy patterns 42 are formed in the resist film 34 and two dummy wells 44 are formed in the silicon substrate 30.

If the wells 36 located in the vicinity of the outermost periphery portion of the memory cell region are taken as dummy wells 44 in the manner as mentioned previously, all functionally-required wells 36 can be formed properly without regard to deformation of the strip-shaped patterns 38 (i.e., the dummy patterns 42). Accordingly, in the present embodiment, a stable characteristic can be imparted to all memory cells which are formed in the memory cell region and are intended to perform functions.

In the first embodiment, two dummy patterns 42 and two dummy wells 44 are formed in the vicinity of the outermost periphery of the memory cell region. However, the number of the dummy patterns 42 and the number of the dummy wells 44 are not limited to two. The dummy pattern 42 and the dummy well 44 may each assume a number of one or a number of three or more.

Second Embodiment

A second embodiment of the present invention will now be described by reference to FIGS. 3A through 5B.

Figure 3A:
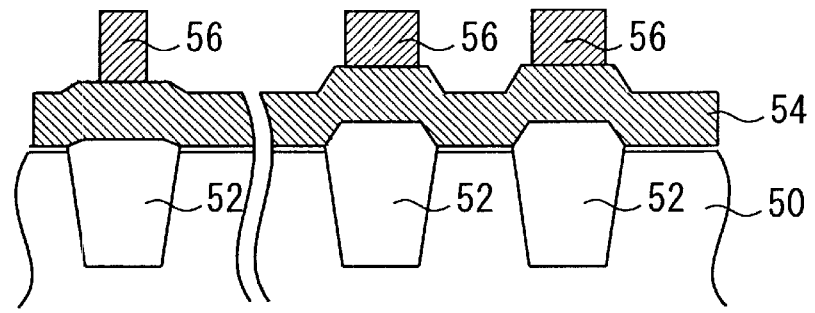
FIGS. 3A and 3B are cross-sectional views for describing a method compared with a manufacturing method according to a second embodiment of the present invention.
Figure 3B:
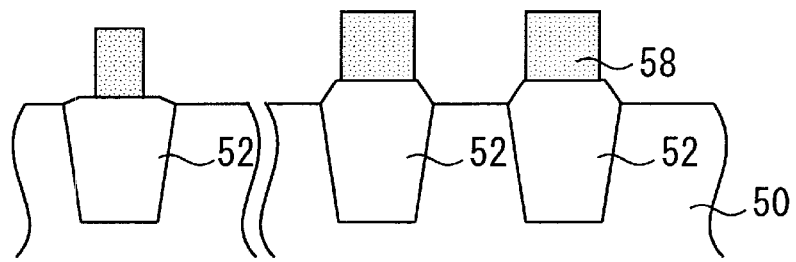

FIGS. 3A and 3B are illustrations for describing a manufacturing method to be compared with the manufacturing method according to the present invention (hereinafter referred to as a "comparative method"). More specifically, FIGS. 3A and 3B are cross-sectional views for describing a process for forming a gate electrode through use of the comparative method.

FIG. 3A shows a silicon substrate 50 having a plurality of isolation oxide films 52 formed therein. The isolation oxide films 52 are formed by means of depositing an oxide film in trenches formed in the silicon substrate 50 and removing unnecessary portions of the films by means of the CMP technique, in the same manner as in the conventional method described in connection with FIGS. 8A to 8D. In this case, for reasons of characteristics of the oxide film, isolation oxide film 52 locating in the vicinity of the center of the memory cell region becomes high and that locating at the periphery of the memory cell region becomes low.

A polysilicon film 54 is deposited on the silicon substrate 50 having the isolation oxide films 52. A resist film 56 is patterned on the polysilicon film 54 by means of photolithography, for use in patterning the polysilicon film 54 into the geometry of a gate electrode. Because of irregularities in the surface height of the isolation oxide films 52, the resist film 56 is thinly formed at the center of the memory cell region and thickly formed at the periphery thereof. Thus, when a portion of the resist film 56 located in the vicinity of the center of the memory cell region and a portion of the resist film 56 located in the vicinity of the periphery of the memory cell region are patterned under identical conditions, there arises dimensional irregularities between the resist film 56 located in the vicinity of the center of the memory cell region and the resist film 56 located in the vicinity of the periphery of the same. Accordingly, if the polysilicon film 54 is etched while the thus-patterned resist films 56 are taken as masks, gate electrodes 58 formed in the vicinity of the center of the memory cell region differ in dimension from those formed in the vicinity of the periphery of the same, as shown in FIG. 3B.

Figure 4:
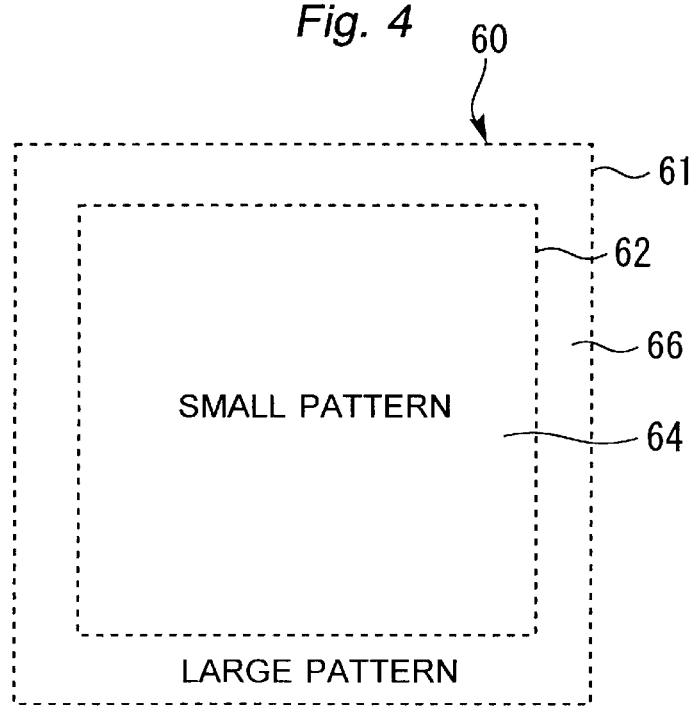
FIG. 4 is a conceptual drawing for describing characteristics of a mask employed in a manufacturing method according to the second embodiment of the present invention.

FIG. 4 is a conceptual drawing for describing the characteristic of a mask 60 employed for manufacturing a semiconductor according to the present embodiment in order to reduce a dimensional difference between the gate electrodes 58.

In FIG. 4, a dotted line shown with reference numeral 61 designates the outermost periphery of the memory cell region of the semiconductor device. A dotted line indicated with reference numeral 62 designates a boundary line between a center region 64 of the memory cell region and a peripheral region 66 of the memory cell region.

In the present embodiment, a pattern prepared for transferring an object in the center region 64 of the mask 60 differs in size from a pattern prepared for transferring the same object in the peripheral region 66 of the mask 60, in order to eliminate irregularities in thickness due to irregularities in the thickness of the resist films 56. More specifically, the pattern prepared for transferring an object in the peripheral region 66 of the mask 60 has a greater size than does the pattern prepared for transferring the same object in the center region 64 of the same, in order to eliminate irregularities in thickness due to the irregularities in the thickness of the resist films 56.

Figure 5A:
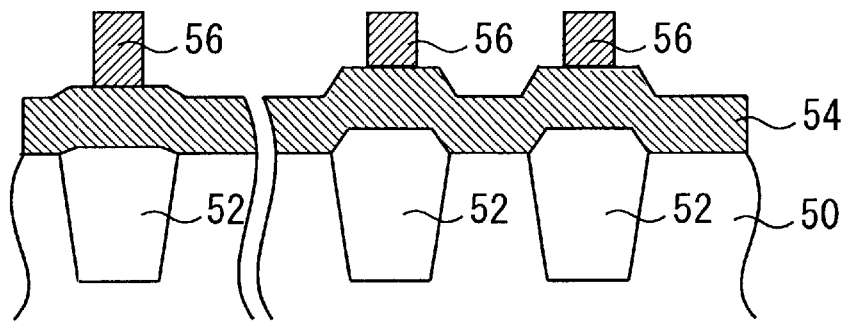
FIGS. 5A and 5B are cross-sectional views for describing the manufacturing method according to the second embodiment of the present invention.
Figure 5B:
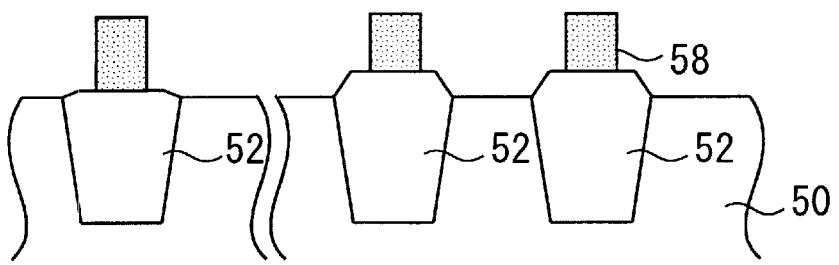

FIGS. 5A and 5B are illustrations for describing a method of manufacturing a semiconductor according to the second embodiment, in which the mask 60 is used for exposing the resist films 56. FIG. 5A shows a state in which the resist film 56 has been patterned through use of the mask 60. FIG. 5B shows a state in which the gate electrodes 58 has been patterned by means of etching while the thus-patterned resist films 56 are taken as masks.

According to the method, correction is performed for eliminating the irregularities in the thickness of the resist films 56 during a photolithography process using the mask 60. As a result, the resist films 56 assume a substantially uniform size throughout the entire memory cell region, regardless of the irregularities in the thickness of the isolation oxide films 52, as shown in FIG. 5A. Accordingly, the present embodiment enables formation of the gate electrodes 56 having uniform size over the entire memory cell region, as shown in FIG. 5B.

In the second embodiment, the pattern prepared for the center region 64 and the pattern prepared for the peripheral region 66 differ in size from each other. However, the technique for producing mask patterns of different sizes is not limited to such a method. For example, a mask pattern may vary in size concentrically from the center of the mask to the outer periphery of the same. Alternatively, the mask pattern may vary in size from the center to the periphery in the lateral direction (i.e., direction X) and the longitudinal direction (i.e., direction Y).

Third Embodiment

A third embodiment of the present invention will now be described by reference to FIG. 6.

Various masks are used for fabricating various chips during the course of manufacture of a semiconductor device such as an ASIC. The proportion in a single shot region of areas occupied by functionally-required patterns differs from mask to mask. For this reason, rendering masks identical with each other in terms of the proportion of holes is difficult. A difference in the proportion of holes between masks is reflected as a difference in the proportion of holes between resist films patterned through use of the masks. A difference in the proportion of holes between resist films is reflected as a difference in etching rate between etching operations which use the resist films as masks. If masks to be used in a single manufacturing process greatly differ from each other in terms of the proportion of holes, some patterns become susceptible to excessive over-etching.

Figure 6:
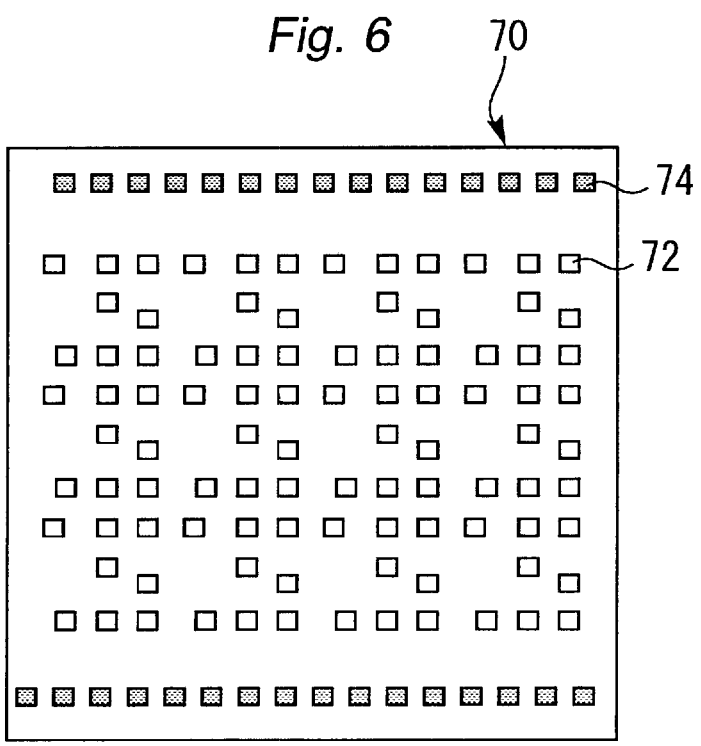
FIG. 6 is a plan view showing an example of a mask employed in a third embodiment of the present invention.

FIG. 6 is a plan view showing an example mask for use in forming contact holes through use of the manufacturing method according to the present embodiment. A mask 70 shown in FIG. 6 has function patterns 72 for forming functionally-required contact holes and dummy patterns 74 which are functionally undesired and provided for rendering the proportion of holes in a mask to a predetermined value.

In the present embodiment, a plurality of masks to be used in a single process are provided with dummy patterns, as is the mask 70 shown in FIG. 6. Hence, the masks have a substantially identical proportion of holes. More specifically, a plurality of masks for use in a process for forming contact holes, a plurality of masks for use in a process for forming through holes, and a plurality of masks for use in a process of forming aluminum wires have respective predetermined proportions of holes. Even when a plurality of masks to be used in a single process differ from each other in terms of the proportion of function patterns, the manufacturing method according to the present embodiment enables manufacture of semiconductor devices of stable quality without involvement of extensive modifications to requirements.

In the present embodiment, gate patterns or a silicon substrate are provided so as to constitute an underlying layer in areas where dummy patterns for contact holes are to be formed. The manufacturing method according to the present embodiment enables prevention of inappropriate etching of the underlying layer during etching of dummy patterns for forming contact holes.

In the third embodiment, the mask 70 for forming contact holes is illustrated as a mask. A mask in which dummy patterns are formed is not limited to a mask for opening contact holes. More specifically, dummy patterns may be formed in a mask for forming through holes or in a mask for patterning aluminum interconnections.

In the third embodiment, the dummy patterns 74 formed in the mask 70 assume the same square geometry as that of the function patterns 72 for forming contact holes. However, the geometry of dummy patterns is not limited to a square shape. Dummy patterns may assume the form of, for example, a slit.

Fourth Embodiment

A fourth embodiment of the present invention will be described by reference to FIG. 7.

Figure 7:
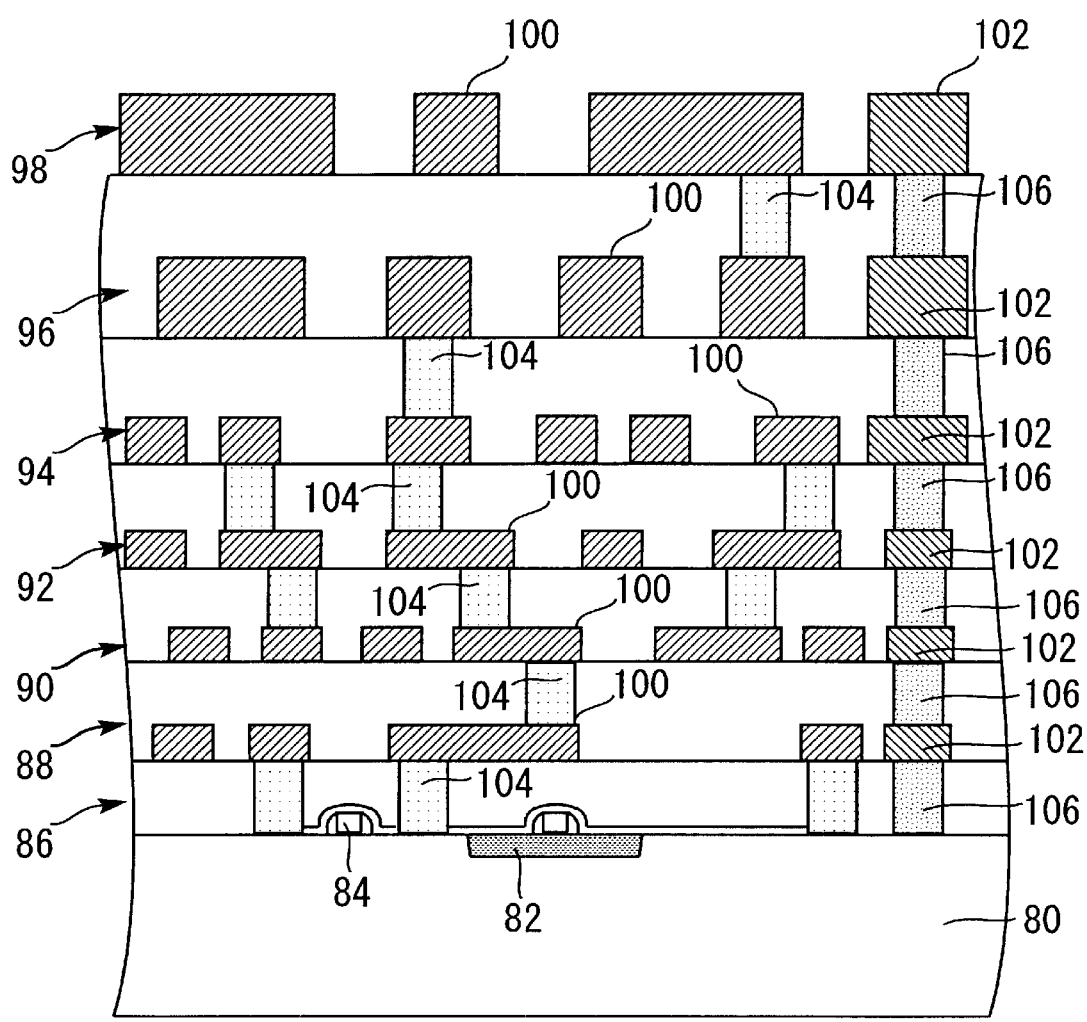
FIG. 7 is a cross-sectional view of a semiconductor device according to a fourth embodiment of the present invention.
Figure 8A:
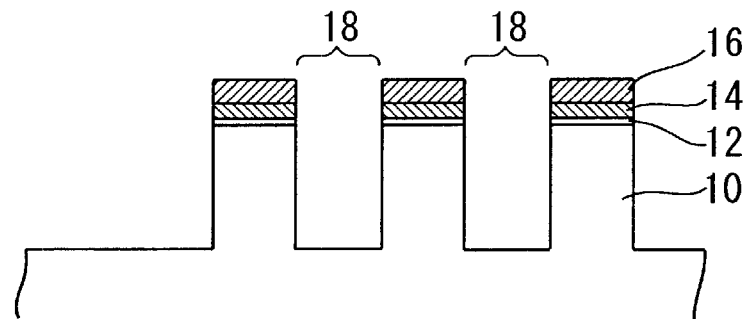
FIGS. 8A through 8D are cross-sectional views for describing a conventional method for manufacturing a semiconductor device.
Figure 8B:
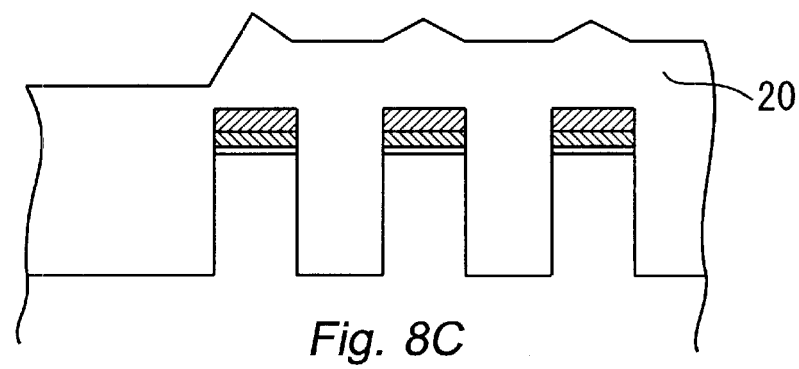
Figure 8C:
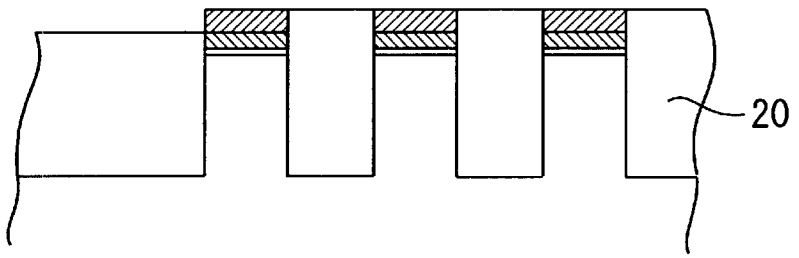
Figure 8D:
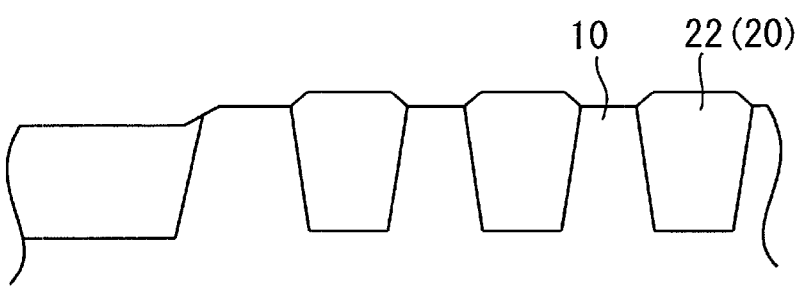

FIG. 7 is a cross-sectional view showing the principal portion of a semiconductor device according to the fourth embodiment. In FIG. 7, reference numeral 80 designates a silicon substrate; 82 designates an isolation oxide film; and 84 designates a gate electrode. An interlayer dielectric film 86 is formed on the silicon substrate 80 so as to cover the gate electrode 84 and the isolation oxide film 82. Six interconnection layers; i.e., a first interconnection layer 88 through a sixth interconnection layer 98, are formed on the interlayer dielectric film 86.

Aluminum patterns 100 functionally required by a semiconductor device (hereinafter called "function patterns 100") and aluminum patterns 102 not functionally desired by the semiconductor device (hereinafter called "dummy patterns 102") are formed in each of the first through sixth interconnection layers 88 through 98. A tungsten plug 104 for forming a desired interconnection construction between the function pattern 100 and the silicon substrate 80 and a tungsten plug 106 for electrically connecting the dummy patterns 102 laid on the respective interconnection layers to the ground terminal of the silicon substrate 80 are provided in the interlayer dielectric film 86. Further, the tungsten plug 104 for forming a desired interconnection construction between the function patterns 100 and the tungsten plug 106 are provided in each of the first through fifth interconnection layers 88 through 96.

The function patterns 100 are formed so that the occupying proportions thereof differ from layer to layer. Hence, the proportion of holes in the masks to be used for forming the function patterns 100 of individual interconnection layers usually differs from each other. In the present embodiment, the dummy patterns 102 are formed in order to rendering the proportions of holes of the masks to be substantially identical, as in the case of the third embodiment. The manufacturing method according to the present embodiment enables easy and highly-accurate manufacture of function patterns 100 in each of the interconnection layers, regardless of the difference among the occupying proportions of the function patterns 100.

The density or pitch of the function patterns 100 is usually not uniform over any given interconnection layer. A difference in density or pitch of function pattern 100 between interconnection layers induces a difference in abrading speed during a CMP process for smoothing individual interconnection layers. In the present embodiment, the dummy patterns 102 are formed in such a layout as to mitigate non-uniform density or pitch of the function patterns 100 within each of interconnection layers. Under the manufacturing method according to the present embodiment, an interconnection pattern layer can be formed such that the entire surface of the layer is finished uniform without regard to irregularities in density or pitch of function patterns.

In a case where the dummy pattern 102 is provided as well as adjacent to the function pattern 100 in an interconnection layer of a semiconductor device, an electrical capacitance arises between the dummy pattern 102 and the adjacent function pattern 100. If the dummy pattern 102 is in an electrically floating state, the capacitance becomes unstable, thus adversely affecting the operation of the semiconductor device.

As mentioned above, in the present embodiment, the dummy patterns 102 provided in all the interconnection layers are connected to the ground terminal of the silicon substrate 80 by way of the tungsten plugs 106. So long as the potentials of the dummy patterns 102 are fixed to the ground potential, the capacitance can be made stable. Therefore, the construction of the semiconductor device according to the fourth embodiment enables formation of a dummy pattern in each of interconnection layers without involvement of deterioration in the operating characteristics of the semiconductor device.

In the present embodiment, capacitance is stabilized by means of fixing the electric potential of the dummy pattern 102 to the ground potential. However, the electric potential of the dummy pattern 102 may be fixed to a predetermined electric potential differing from the ground potential.

In the present embodiment, the dummy pattern 102 may be spaced a given distance apart from an adjacent pattern. So long as the distance between the dummy pattern 102 and an adjacent pattern is made constant, the accuracy of simulation of capacitance which would arise between the dummy patterns can be improved. Such a construction facilitates design of circuits of a semiconductor device when compared with the design of circuits of a semiconductor device in which the distance between a dummy pattern and an adjacent pattern is not uniform.

The dummy patterns 102 or the tungsten plugs 106 formed in the present embodiment may be used as a wafer process managing monitor. More specifically, the dummy pattern 102 and the tungsten plug 106 laid on the first interconnection layer 88 are connected in a chained manner to the dummy pattern 102 laid in the second interconnection layer 90. The electrical characteristic of the thus-formed chained interconnection may be used as a criteria for managing a wafer process.

Since the present invention is embodied in the manner as mentioned previously, the invention yields the following advantages.

According to a first aspect of the present invention, one or a plurality of impurity-diffused layers (wells) located at the outermost position can be taken as dummy layers. In some cases, the impurity-diffused layers located at the outermost position fail to have an appropriate characteristic, under influence of inclination of resist films. In the present invention, the impurity-diffused layers having such unstable characteristics are taken as dummy layers, thereby stabilizing the characteristic of a semiconductor device.

According to a second aspect of the present invention, a mask pattern is formed such that a portion of the mask pattern located in the vicinity of the center of a memory cell region differs from a portion of the mask pattern located in the vicinity of the periphery of the memory cell, in terms of the size for forming resist films. As a result, irregularities in the thickness of resist films ascribable to irregularities in the thickness of isolation oxide films are compensated for, and hence resist films can be patterned accurately to the same size over the entire surface of the memory cell region.

According to a third aspect of the present invention, a plurality of masks for use in forming a plurality of layers can be formed so as to assume identical proportions of holes. Accordingly, desired constituent elements can be formed in respective layers accurately without involvement of significant modifications to process conditions.

According to a fourth aspect of the present invention, a dummy pattern is fixed to a predetermined potential, thereby stabilizing capacitance developing between the dummy pattern and an adjacent pattern.

According to a fifth aspect of the present invention, the distance between a dummy pattern and an adjacent pattern is made uniform, thereby making capacitance developing between the dummy pattern and the adjacent pattern uniform.

According to a seventh aspect of the present invention, there can be implemented an interconnection element for monitoring a wafer process by means of utilization of a dummy pattern and a plug formed in a semiconductor device.

Further, the present invention is not limited to these embodiments, but variations and modifications may be made without departing from the scope of the present invention.

The entire disclosure of Japanese Patent Application No. 2000–309140 filed on Oct. 10, 2000 including specification, claims, drawings and summary are incorporated herein by reference in its entirety.

What is claimed is:

1. A semiconductor device comprising:
   constituent elements of the same kind which are provided in a plurality of layers;
   dummy patterns such that the constituent elements are provided in substantially identical proportions in the plurality of layers; and
   interconnection elements for fixing the electric potential of the dummy patterns to a predetermined electric potential.

2. A semiconductor device comprising:
   dummy patterns formed such that constituent elements are provided in a predetermined layer so as to assume a uniform density or pitch over the entire surface of the predetermined layer; and
   interconnection elements for fixing the electric potential of the dummy patterns to a predetermined electric potential.

3. The semiconductor device according to claim 1, wherein the predetermined potential is a ground potential.

4. The semiconductor device according to claim 2, wherein the predetermined potential is a ground potential.

5. The semiconductor device according to claim 1, wherein the dummy patterns are provided such that a given distance is ensured between the dummy pattern and an adjacent pattern.

6. The semiconductor device according to claim 2, wherein the dummy patterns are provided such that a given distance is ensured between the dummy pattern and an adjacent pattern.

* * * * *